US012267077B2

(12) United States Patent
Kato et al.

(10) Patent No.: US 12,267,077 B2
(45) Date of Patent: Apr. 1, 2025

(54) DLL CIRCUIT, TIME DIFFERENCE AMPLIFIER CIRCUIT, AND DISTANCE-MEASURING IMAGING DEVICE

(71) Applicant: NUVOTON TECHNOLOGY CORPORATION JAPAN, Kyoto (JP)

(72) Inventors: Takumi Kato, Osaka (JP); Kazuo Matsukawa, Osaka (JP); Toshiaki Ozeki, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 965 days.

(21) Appl. No.: 17/345,445

(22) Filed: Jun. 11, 2021

(65) Prior Publication Data

US 2021/0344347 A1     Nov. 4, 2021

Related U.S. Application Data

(63) Continuation of application No. PCT/JP2019/049308, filed on Dec. 17, 2019.

(30) Foreign Application Priority Data

Dec. 18, 2018    (JP) ................. 2018-236306

(51) Int. Cl.
     *H03L 7/081*      (2006.01)
     *G01S 17/894*     (2020.01)
     *H03K 5/24*      (2006.01)

(52) U.S. Cl.
     CPC .......... *H03L 7/0812* (2013.01); *G01S 17/894* (2020.01)

(58) Field of Classification Search
     CPC ... H03L 7/0812; G01S 17/894; G01S 7/4915; H03K 5/24; G01C 3/06; H04N 25/779

(Continued)

(56) References Cited

U.S. PATENT DOCUMENTS 8,669,810 B2   3/2014   Kwon et al.
8,976,054 B2*   3/2015   Dosho .................. G04F 10/005
                                                                327/146

(Continued)

FOREIGN PATENT DOCUMENTS

CN       105656477 A   *   6/2016
JP       2009-236657 A     10/2009

(Continued)

OTHER PUBLICATIONS

Wang et al "An Ultra-Low-Power Fast-Lock-In Small-Jitter All-Digital DLL", 3 pp. (Year: 2005).*

(Continued)

*Primary Examiner* — Daniel L Murphy
(74) *Attorney, Agent, or Firm* — Rimon P.C.

(57) ABSTRACT

A DLL circuit includes: a time difference amplifier circuit that includes current sources for setting a time difference amplification factor and an input time difference range, and amplifies, to a first signal and a second signal which are input, a time difference between edges which are change points of logic levels respectively included in the first and second signals, using the current sources and outputting a first amplified signal and a second amplified signal obtained; a phase comparison circuit that calculates a phase difference between the first and second amplified signals output and outputs a phase difference signal indicating the phase difference calculated; and a variable delay circuit that delays the second signal by an amount of delay depending on the phase difference indicated by the phase difference signal output from the phase comparison circuit and outputs the delayed second signal as a delayed signal.

14 Claims, 7 Drawing Sheets

(58) Field of Classification Search
USPC .......................................................... 356/4.01
See application file for complete search history.

(56) References Cited

U.S. PATENT DOCUMENTS

| | | |
|---|---|---|
| 2013/0335251 A1 | 12/2013 | Dosho et al. |
| 2015/0177701 A1 | 6/2015 | Seidel |
| 2019/0311761 A1 | 10/2019 | Chang et al. |

FOREIGN PATENT DOCUMENTS

| | | |
|---|---|---|
| JP | 2019-185841 A | 10/2019 |
| WO | 2012/120569 A1 | 9/2012 |

OTHER PUBLICATIONS

English translation of Li et al., CN 10565477, description translation created 2024, 21 pp. (Year: 2024).*
English translation of Li et al., CN 10565477, abstract translation retrieved 2024, 1 p. (Year: 2024).*
English translation of Li et al., CN 10565477, claims translation created 2024, 5 pp. (Year: 2024).*
International Search Report and Written Opinion issued on Feb. 25, 2020, in International Application No. PCT/JP2019/049308 with partial English translation.

* cited by examiner

| | Period $t_1$ | Period $t_2$ | Period $t_3$ |
|---|---|---|---|
| First switch 23a | OFF | ON | ON |
| Second switch 24a | ON | ON | OFF |
| Third switch 25a | ON | OFF | OFF |
| Fourth switch 23b | OFF | OFF | ON |
| Fifth switch 24b | ON | OFF | OFF |
| Sixth switch 25b | ON | ON | OFF |

FIG. 8

DLL CIRCUIT, TIME DIFFERENCE AMPLIFIER CIRCUIT, AND DISTANCE-MEASURING IMAGING DEVICE

CROSS REFERENCE TO RELATED APPLICATIONS

This is a continuation application of PCT International Application No. PCT/JP2019/049308 filed on Dec. 17, 2019, designating the United States of America, which is based on and claims priority of Japanese Patent Application No. 2018-236306 filed on Dec. 18, 2018. The entire disclosures of the above-identified applications, including the specifications, drawings and claims are incorporated herein by reference in their entirety.

FIELD

The present disclosure relates to a delay-locked loop (DLL) circuit, a time difference amplifier circuit used in the DLL circuit, and a distance-measuring imaging device including the DLL circuit.

BACKGROUND

Patent Literature (PTL) 1 discloses a DLL circuit suitable for a dynamic random access memory (DRAM). Here, the DLL circuit is a circuit that generates a signal having a required phase by using a clock signal given from the outside.

CITATION LIST

Patent Literature

PTL 1: Japanese Unexamined Patent Application Publication No. 2019-185841

SUMMARY

Technical Problem

The prior art disclosed in PTL 1 has a problem that it is difficult to adjust a minute phase difference.

Therefore, an object of the present disclosure is to provide a DLL circuit, a time difference amplifier circuit, and a distance-measuring imaging device capable of adjusting a minute phase difference.

Solution to Problem

The DLL circuit according to one aspect of the present disclosure includes: a time difference amplifier circuit that includes a plurality of current sources for setting a time difference amplification factor and an input time difference range, the time difference amplifier circuit amplifying, to a first signal and a second signal which are input, a time difference between an edge that is a change point of a logic level included in the first signal and an edge that is a change point of a logic level included in the second signal, using the plurality of current sources and outputting a first amplified signal and a second amplified signal obtained; a phase comparison circuit that calculates a phase difference between the first amplified signal and the second amplified signal output from the time difference amplifier circuit and outputs a phase difference signal indicating the phase difference calculated; and a variable delay circuit that delays the second signal by an amount of delay depending on the phase difference indicated by the phase difference signal output from the phase comparison circuit and outputs a delayed signal obtained by delaying the second signal.

In addition, the time difference amplifier circuit according to one aspect of the present disclosure is a time difference amplifier circuit included in the DLL circuit described above.

In addition, the distance-measuring imaging device according to one aspect of the present disclosure includes: a light receiver that performs photoelectric conversion; a DLL circuit described above; and a timing control circuit that gives the second signal to the DLL circuit, wherein the DLL circuit outputs the delayed signal to at least one of a light source drive circuit that drives a light source for distance measurement or an exposure drive circuit that drives the light receiver for exposure, and receives a feedback signal output from the at least one as the first signal.

Advantageous Effects

According to the present disclosure, a DLL circuit, a time difference amplifier circuit, and a distance-measuring imaging device capable of adjusting a minute phase difference are provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

First, before explaining the DLL circuit according to the present disclosure, a general DLL circuit will be described.

Figure 1:
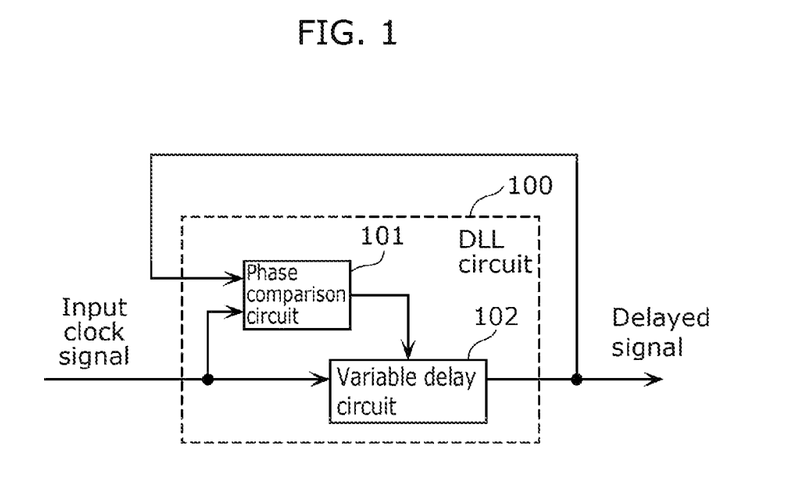
FIG. 1 is a block diagram showing a configuration of a general DLL circuit.

FIG. 1 is a block diagram showing a configuration of general DLL circuit 100. DLL circuit 100 is a circuit that generates a delayed signal that is delayed by a required phase with respect to the input clock signal, and includes phase comparison circuit 101 that compares the phase difference between the input dock signal and the delayed signal, and variable delay circuit 102 that delays the input clock signal by an amount of delay depending on the phase difference indicated by the phase difference signal output from phase comparison circuit 101 and outputs a delayed signal obtained by delaying the input clock signal.

DLL circuit 100 having such a configuration generates a delayed signal that is synchronized with the input clock signal and delayed by a required phase with respect to the input clock signal.

However, such general DLL circuit 100 has a problem that it is difficult to adjust a minute phase difference.

Figure 2:
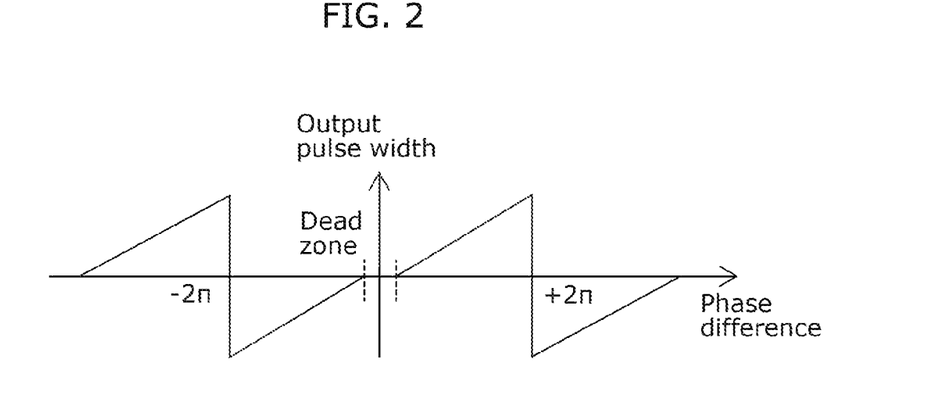
FIG. 2 is a diagram illustrating a problem included in the general DLL circuit shown in FIG. 1.

FIG. 2 is a diagram illustrating a problem included in general DLL circuit 100 shown in FIG. 1. Here, a characteristic of phase comparison circuit 101 included in general DLL circuit 100 is shown. The horizontal axis shows the phase difference between the two signals input to phase comparison circuit 101, and the vertical axis shows the phase difference signal (here, the output pulse width) output by phase comparison circuit 101.

Ideally, the phase difference signal should increase in proportion to the phase difference, but a dead zone for the input of a minute phase difference exists in phase comparison circuit 101 so that a phase difference signal indicating zero is output for the input of a minute phase difference as shown in FIG. 2. As a result, it is difficult to adjust a minute phase difference in general DLL circuit 100.

Therefore, an object of the present disclosure is to provide a DLL circuit, a time difference amplifier circuit, and a distance-measuring imaging device capable of adjusting a minute phase difference.

Hereinafter, embodiments of the DLL circuit, the time difference amplifier circuit, and the distance-measuring imaging device according to the present disclosure will be described in detail with reference to the drawings. It should be noted that each of the embodiments described below will show a specific example of the present disclosure. The numerical values, shapes, materials, components, arrangement positions and connection forms of the components, drive timings, and the like shown in the following embodiments are examples, and are not intended to limit the present disclosure. In addition, each drawing is not necessarily exactly illustrated. In each drawing, duplicate description will be omitted or simplified for substantially the same configuration.

Embodiment 1

Figure 3:
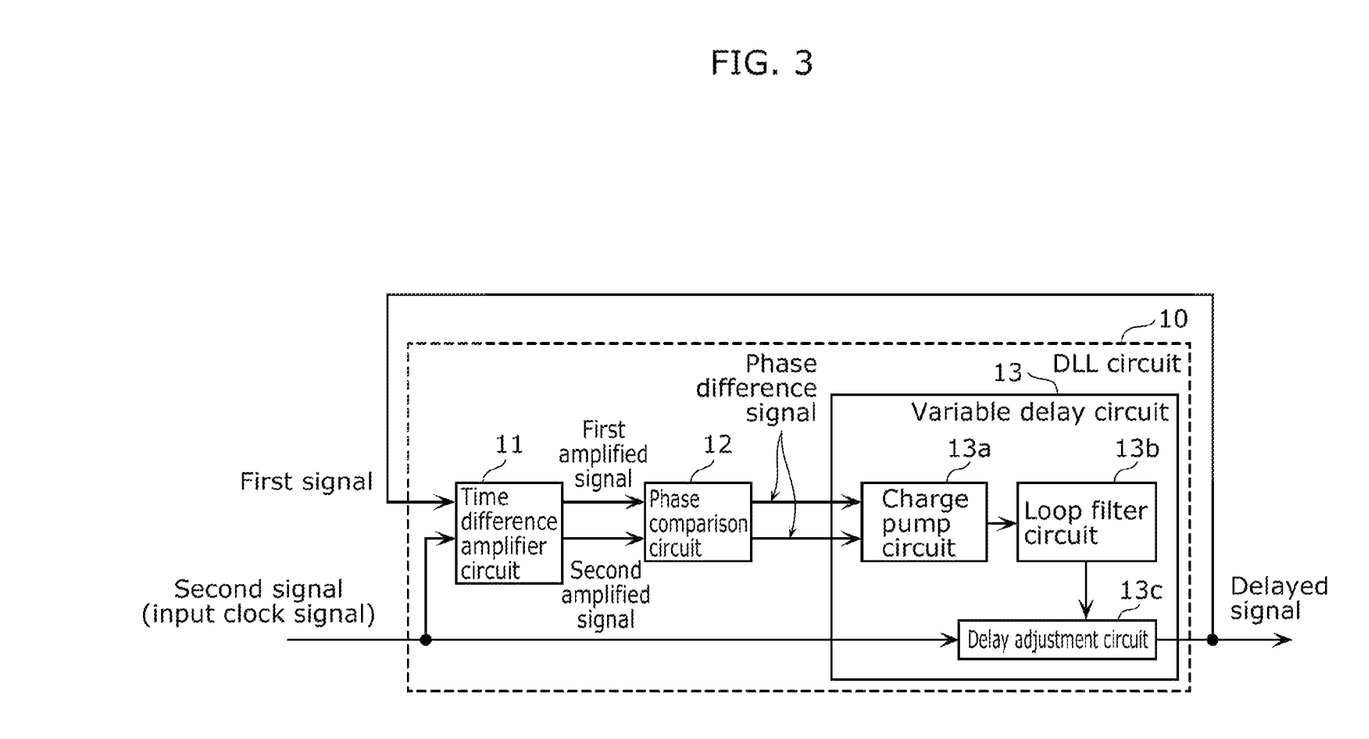
FIG. 3 is a block diagram showing a configuration of a DLL circuit according to Embodiment 1.

FIG. 3 is a block diagram showing the configuration of DLL circuit 10 according to Embodiment 1. DLL circuit 10 is a circuit that generates a delayed signal that is delayed by a required phase with respect to the input clock signal, and includes time difference amplifier circuit 11, phase comparison circuit 12, and variable delay circuit 13.

Time difference amplifier circuit 11 is a circuit that applies processing for amplifying a time difference (that is, a phase difference) between an edge that is a change point of a logic level included in a first signal (here, a delayed signal output from DLL circuit 10) and an edge that is a change point of a logic level included in a second signal (here, an input clock signal) to the first signal input and the second signal input using the plurality of current sources and outputting a first amplified signal and a second amplified signal obtained. It should be noted that the output of time difference amplifier circuit 11 does not necessarily have to be configured by two physically independent signals (the first amplified signal and the second amplified signal), and it may be one signal as long as it is a signal indicating the time difference after amplification. For example, it may be one signal indicating the time difference after amplification by the period between the rising edge and the falling edge.

Phase comparison circuit 12 is a circuit that calculates the phase difference between the first amplified signal and the second amplified signal output from time difference amplifier circuit 11 and outputs a phase difference signal indicating the calculated phase difference. In the present embodiment, the phase difference signal is configured by two signals for causing charge pump circuit 13a to function as a current source and a current sink, respectively, as shown in FIG. 3. It should be noted that the output of phase comparison circuit 12 does not necessarily have to be configured by two physically independent signals, and may be configured by one signal as long as it is a signal for switching charge pump circuit 13a as a current source and a current sink.

Variable delay circuit 13 is a circuit that delays the second signal by the amount of delay depending on the phase difference indicated by the phase difference signal output from phase comparison circuit 12 and outputs a delayed signal obtained by delaying the second signal to the external and time difference amplifier circuits 11. Variable delay circuit 13 is configured by charge pump circuit 13a that outputs a current corresponding to the phase difference indicated by the phase difference signal output from phase comparison circuit 101, loop filter circuit 13b that stores or discharges electricity according to the current output from charge pump circuit 13a, and delay adjustment circuit 13c that delays the second signal according to the voltage output by loop filter circuit 13b.

Charge pump circuit 13a is configured by, for example, a current source that functions as a current source and a switch element that turns the current source on and off, and a current source that functions as a current sink and a switch element that turns the current source on and off, according to the phase difference signals (two signals) output from phase comparison circuit 101.

Loop filter circuit 13b is configured by, for example, a capacitor that stores or discharges electricity according to the current discharged and the current sucked in by charge pump circuit 13a.

Delay adjustment circuit 13c is configured by, for example, a plurality of buffer amplifiers connected in multiple stages and a variable current source that changes the current supplied to each of the plurality of buffer amplifiers according to the voltage output by loop filter circuit 13b.

According to DLL circuit 10 according to the present embodiment configured as described above, the time difference between the first signal and the second signal that are input is amplified in time difference amplifier circuit 11, a phase difference signal indicating the phase difference between the first amplified signal and the second amplified signal output from time difference amplifier circuit 11 is output in phase comparison circuit 12, and in variable delay circuit 13, the second signal is delayed by the amount of delay depending on the phase difference indicated by the phase difference signal output from phase comparison circuit 12 to be output to the outside as a delayed signal and fed back to time difference amplifier circuit 11.

In this way, according to DLL circuit 10 according to the present embodiment, the two input signals are input to phase comparison circuit 12 after the time difference is amplified by time difference amplifier circuit 11. With this, even if the phase difference between the two input signals is minute, the phase difference is expanded to the outside of the dead zone of phase comparison circuit 12, and then the phase comparison is performed, so that DLL circuit 10 capable of adjusting a minute phase difference is realized as compared with general DLL circuit 100 with no time difference amplifier circuit.

Figure 4:
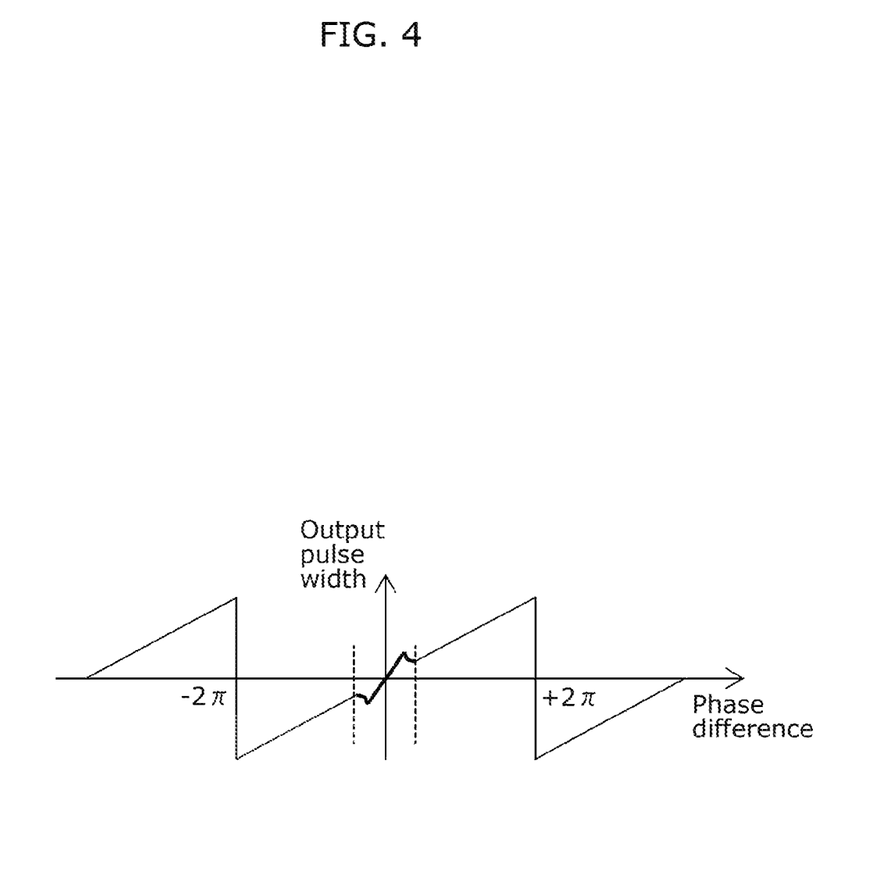
FIG. 4 is a diagram showing a characteristic operation of the DLL circuit according to Embodiment 1.

FIG. 4 is a diagram showing a characteristic operation of DLL circuit 10 according to Embodiment 1. That is, this figure corresponds to FIG. 2 for illustrating general DLL circuit 100. According to DLL circuit 10, the time difference between the two input signals is amplified in time difference amplifier circuit 11. For that reason, for the input of a minute phase difference, the phase difference signal (here, the output pulse width) corresponding to the phase difference, that is, the phase difference signal corresponding to the phase difference after amplification is output in phase comparison circuit 12 as shown in FIG. 4. As a result, even if the phase difference between the two input signals is minute, the generation of the dead zone is suppressed, the delay corresponding to the phase difference is surely performed, and DLL circuit 10 capable of adjusting a minute phase difference is realized.

Figure 5:
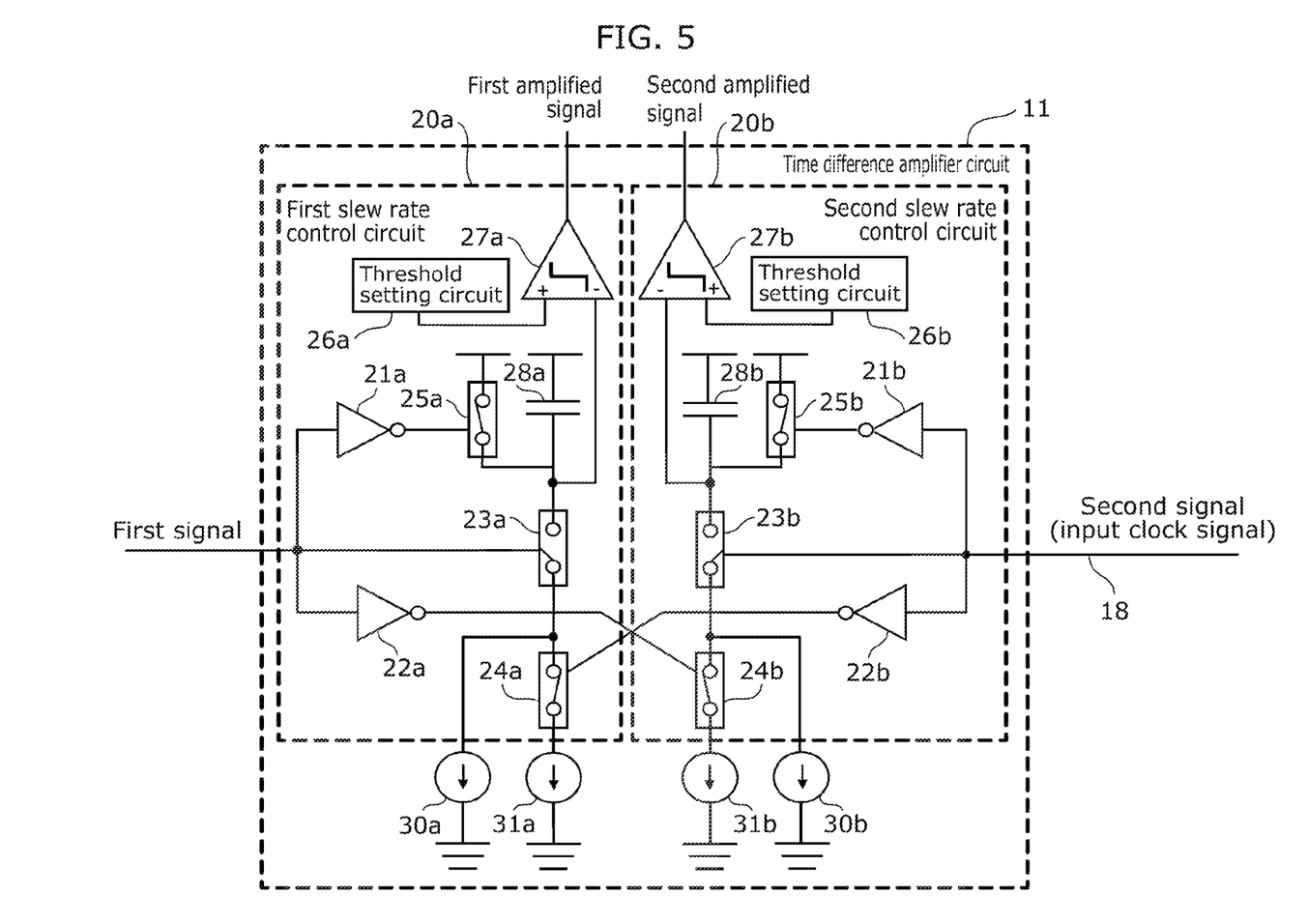
FIG. 5 is a block diagram showing a detailed configuration of a time difference amplifier circuit included in the DLL circuit according to Embodiment 1.

FIG. 5 is a block diagram showing a detailed configuration of time difference amplifier circuit 11 included in DLL circuit 10 according to Embodiment 1. Time difference amplifier circuit 11 includes a plurality of current sources (first current source 30a, second current source 31a, third current source 30b and fourth current source 31b), and control circuits (first slew rate control circuit 20a and a second slew rate control circuit 20b) that switches between a large current mode that operates at least two of the plurality of current sources and a small current mode that operates only one of the plurality of current sources according to the combination of the logic levels of the first signal and the second signal that are input.

More specifically, first slew rate control circuit 20a includes first inverters 21a and 22a, first switch 23a, second switch 24a, third switch 25a, first threshold setting circuit 26a, first comparator 27a, and first capacitor 28a.

First inverters 21a and 22a are logic circuits that invert the logic level of the input first signal.

First switch 23a is a switch that is turned on and off according to the logic level of the first signal, one end is connected to third switch 25a, first capacitor 28a, and the negative electrode input terminal that is the first input terminal of first comparator 27a, and the other end is connected to second switch 24a.

Second switch 24a is turned on and off by the logic level of the output signal from second inverter 22b included in second slew rate control circuit 20b (that is, a signal obtained by inverting the logic level of the second signal), one end is connected to first current source 30a and the other end of first switch 23a, and the other end is connected to second current source 31a.

Third switch 25a is turned on and off according to the logic level of the output signal from first inverter 21a, one end is connected to power supply potential VDD, and the other end is connected to first capacitor 28a and the like. It should be noted that in the present embodiment, first switch 23a, second switch 24a, and third switch 25a are all turned on when High is input as the logic level.

First capacitor 28a is a capacitor having capacitance C in which one end is connected to the reference potential, and the other end is connected to first current source 30a via first switch 23a and is connected to second current source 31a via second switch 24a.

First threshold setting circuit 26a is a voltage source that outputs predetermined voltage Vth as a threshold voltage to the positive electrode input terminal which is the second input terminal of first comparator 27a.

First comparator 27a compares the voltage of first capacitor 28a connected to the negative electrode input terminal with predetermined voltage Vth (that is, the threshold voltage) output by first threshold setting circuit 26a supplied to the positive electrode input terminal, and outputs the comparison result as the first amplified signal.

Second slew rate control circuit 20b includes second inverters 21b and 22b, fourth switch 23b, fifth switch 24b, sixth switch 25b, second threshold setting circuit 26b, second comparator 27b, and second capacitor 28b.

Second inverters 21b and 22b are logic circuits that invert the logic level of the input second signal, Fourth switch 23b is a switch that is turned on and off according to the logic level of the second signal, one end is connected to sixth switch 25b, second capacitor 28b, and the negative electrode input terminal that is the first input terminal of second comparator 27b, and the other end is connected to fifth switch 24b.

Fifth switch 24b is turned on and off by the logic level of the output signal from first inverter 22a included in first slew rate control circuit 20a (that is, a signal obtained by inverting the logic level of the first signal), one end is connected to third current source 30b and the other end of fourth switch 23b, and the other end is connected to fourth current source 31b.

Sixth switch 25b is turned on and off by the logic level of the output signal from second inverter 21b, one end is connected to power supply potential VDD, and the other end is connected to second capacitor 28b and the like. It should be noted that in the present embodiment, fourth switch 23b, fifth switch 24b, and sixth switch 25b are all turned on when High is input as the logic level.

Second capacitor 28b is a capacitor having capacitance C in which one end is connected to the reference potential, and the other end is connected to third current source 30b via fourth switch 23b and is connected to fourth current source 31b via fourth switch 23b and fifth switch 24b.

Second threshold setting circuit 26b is a voltage source that outputs predetermined voltage Vth as a threshold voltage to the positive electrode input terminal which is the second input terminal of second comparator 27b.

Second comparator 27b compares the voltage of second capacitor 28b connected to the negative electrode input terminal with predetermined voltage Vth (that is, the threshold voltage) output by second threshold setting circuit 26b supplied to the positive electrode input terminal, and outputs the comparison result as the second amplified signal.

It should be noted that in the present embodiment, the respective output currents of first current source 30a and third current source 30b are assumed to be is, and the respective output currents of second current source 31a and fourth current source 31b are assumed to be $i_L$.

Figure 6:
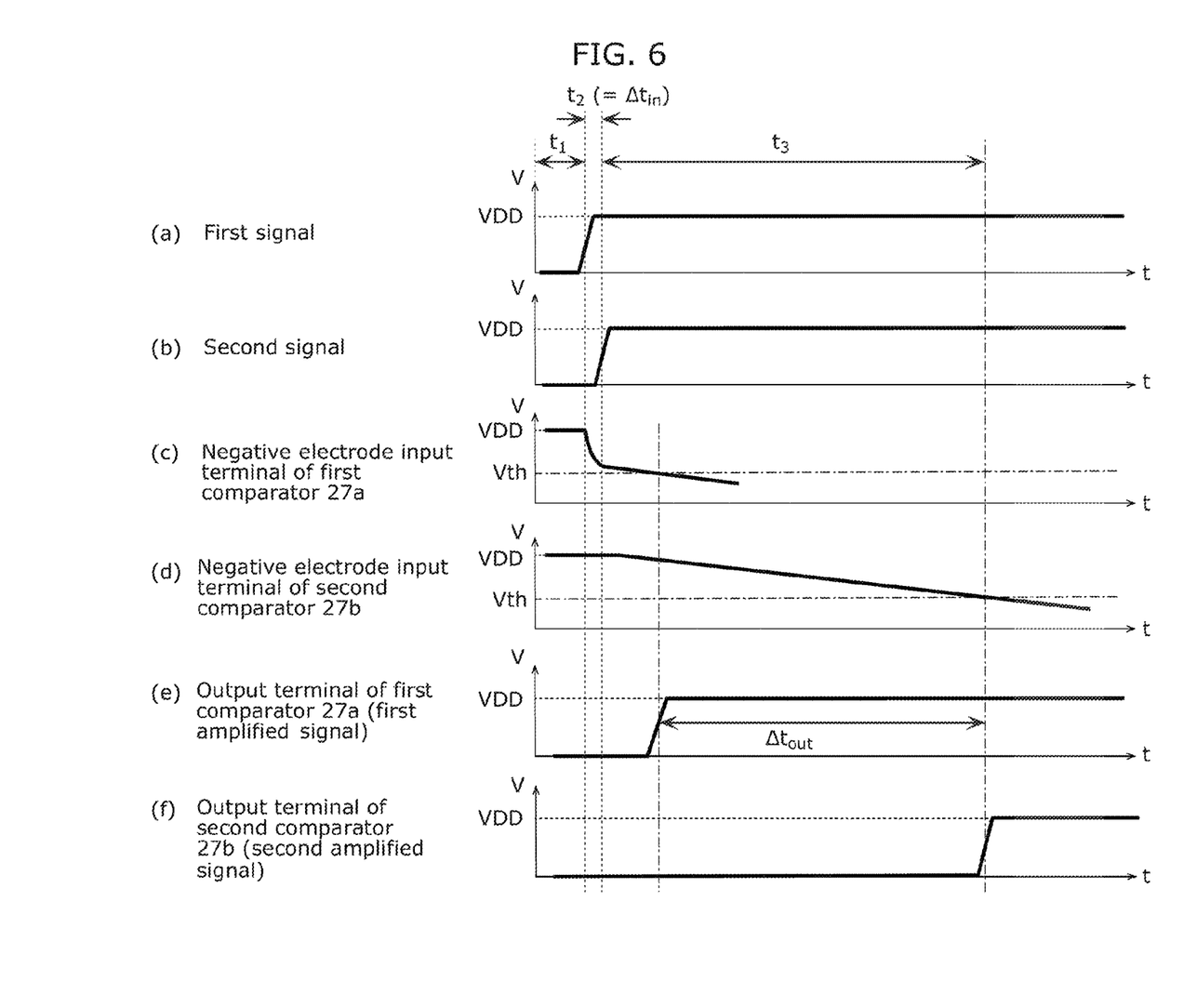
FIG. 6 is a timing chart showing the operation of the time difference amplifier circuit shown in FIG. 5.

FIG. 6 is a timing chart showing the operation of time difference amplifier circuit 11 shown in FIG. 5. (a) in FIG. 6 shows the voltage waveform of the first signal, (b) in FIG. 6 shows voltage waveform of the second signal, (c) in FIG. 6 shows the voltage waveform of the negative electrode input terminal of first comparator 27a, (d) in FIG. 6 shows the voltage waveform of the negative electrode input terminal of second comparator 27b, (e) in FIG. 6 shows the voltage waveform of the output terminal of first comparator 27a (that is, the first amplified signal), and (f) in FIG. 6 shows the voltage waveform of the output terminal of second comparator 27b (that is, the second amplified signal).

Figure 7:
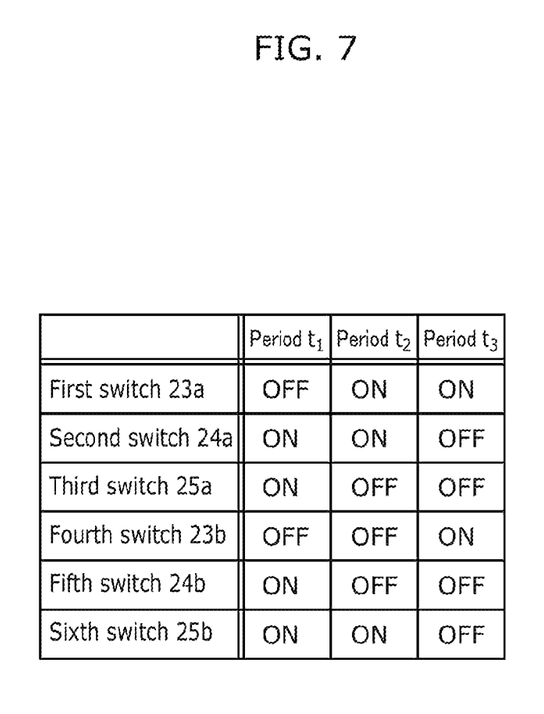
FIG. 7 is a diagram showing the on/off states of the first switch to the sixth switch of the time difference amplifier circuit during periods t1 to t3 shown in FIG. 6.

FIG. 7 is a diagram (table) showing on/off states of first switch 23a to sixth switch 25b of time difference amplifier circuit 11 during periods t1 to t3 shown in FIG. 6.

Now, as shown in (a) and (b) in FIG. 6, it is assumed that a positive phase difference in which the logic level of the first signal changes first (from Low to High) and then the logic level of the second signal changes (from Low to High)

occurs. That is, as shown in (a) in FIG. 6, it is assumed that the first signal is Low in period t1 and High in period t2 and thereafter. In addition, as shown in (b) in FIG. 6, it is assumed that the second signal is Low in period t1 and period t2 and High in period t3 and thereafter.

Then, in period t1, both the first signal and the second signal are Low, so that first switch 23a and fourth switch 23b are turned off, and second switch 24a, third switch 25a, fifth switch 24b, and sixth switch 25b are turned on, as shown in period t1 in FIG. 7.

As a result, in first slew rate control circuit 20a, third switch 25a is on and first switch 23a is off, so that first capacitor 28a is connected to power supply potential VDD via third switch 25a to be in a charged state. Therefore, the voltage of the negative electrode input terminal of first comparator 27a connected to first capacitor 28a becomes power supply potential VDD ((c) in FIG. 6). With this, in first comparator 27a, voltage VDD of the negative electrode input terminal is higher than voltage Vth of the positive electrode input terminal, so that the Low level is output as the first amplified signal ((e) in FIG. 6).

Similarly, in second slew rate control circuit 20b, sixth switch 25b is on and fourth switch 23b is off, so that second capacitor 28b is connected to power supply potential VDD via sixth switch 25b to be in a charged state. Therefore, the voltage of the negative electrode input terminal of second comparator 27b connected to second capacitor 28b becomes power supply potential VDD ((d) in FIG. 6). With this, in second comparator 27b, voltage VDD of the negative electrode input terminal is higher than voltage Vth of the positive electrode input terminal, so that the Low level is output as the second amplified signal ((f) in FIG. 6).

Subsequently, in period t2, the first signal becomes High, so that first switch 23a is turned on and third switch 25a and fifth switch 24b are turned off (other switches remain the same states) as shown in period t2 in FIG. 7.

As a result, in first slew rate control circuit 20a, third switch 25a is turned off and first switch 23a and second switch 24a are turned on, so that first capacitor 28a is connected to two of first current sources 30a and second current source 31a (large current mode) and starts abrupt discharge at the total output current $(i_s+i_L)$ of first current source 30a and second current source 31a ((c) in FIG. 6).

On the other hand, in second slew rate control circuit 20b, the states of sixth switch 25b and fourth switch 23b are maintained, so that the voltage of the negative electrode input terminal of second comparator 27b does not change ((d) in FIG. 6), and the output voltage of second comparator 27b (the second amplified signal) does not change, either ((f) in FIG. 6).

Subsequently, in period t3, the second signal becomes High, so that second switch 24a and sixth switch 25b are turned off and fourth switch 23b is turned on (other switches remain the same states), as shown in period t3 in FIG. 7.

As a result, in first slew rate control circuit 20a, second switch 24a is turned off, so that first capacitor 28a is switched so as to be connected only to first current source 30a (small current mode), and is switched to a gradual discharge due to the output current $(i_s)$ of first current source 30a ((c) in FIG. 6). After that, when the voltage of the negative electrode input terminal of first comparator 27a drops to predetermined voltage Vth (the threshold voltage of the positive electrode input terminal), High level is output from first comparator 27a as the first amplified signal ((e) in FIG. 6). In this way, from period t2 to period t3, the large current mode is switched to the small current mode in a continuous time (first current source 30a remains on and only second current source 31a turns off), so that it becomes possible to perform time difference amplification for a minute input time difference.

On the other hand, in second slew rate control circuit 20b, sixth switch 25b is turned off, fourth switch 23b is turned on, and fifth switch 24b remains off, so that second capacitor 28b is connected only to third current source 30b (small current mode), and starts a gradual discharge due to the output current $(i_s)$ of third current source 30b ((d) in FIG. 6), After that, when the voltage of the negative electrode input terminal of second comparator 27b drops to predetermined voltage Vth (the threshold voltage of the positive electrode input terminal), High level is output from second comparator 27b as the second amplified signal ((f) in FIG. 6).

In this way, the first signal and the second signal are waveforms whose logic level changes (that is, rises) with a slight difference of period t2, but during that period t2, in first slew rate control circuit 20a, first capacitor 28a is rapidly discharged by the large current mode (that is, in the current $(i_s+i_L)$), while in second slew rate control circuit 20b, second capacitor 28b is not discharged. Then, in subsequent period t3, in first slew rate control circuit 20a and second slew rate control circuit 20b, first capacitor 28a and second capacitor 28b are discharge gradually by the small current mode (that is, in the current $(i_s)$), respectively.

Therefore, the time difference (that is, the phase difference) between the timing when the input voltage (that is, the voltage of the negative electrode input terminal) of first comparator 27a reaches the threshold voltage (that is, voltage Vth of the positive electrode input terminal) and the timing when the input voltage (that is, the voltage of the negative electrode input terminal) of second comparator 27b reaches the threshold voltage (that is, voltage Vth of the positive electrode input terminal) becomes larger than period t2. As a result, the time difference (that is, output time difference $\Delta t_{out}$) between the timing when the first amplified signal output from first comparator 27a becomes High and the timing when the second amplified signal output from second comparator 27b becomes the time difference in which period t2 (input time difference $\Delta t_{in}$) is amplified.

It should be noted that the above example is the case where a positive phase difference in which the logic level of the first signal changes first and then the logic level of the second signal changes is input, but on the contrary, even in the case where a negative phase difference in which the logic level of the second signal changes first and then the logic level of the first signal changes is input, the operation in first slew rate control circuit 20a and the operation in second slew rate control circuit 20b are only exchanged, and the input time difference (that is, the input phase difference) is amplified by the same processing. This is because first slew rate control circuit 20a and second slew rate control circuit 20b basically have the same configuration.

Next, the characteristic of time difference amplifier circuit 11 that operates as described above will be described more quantitatively.

As can be seen from FIG. 6, assuming that the input time difference (that is, the time difference between the rising edges of the first signal and the second signal, period t2) is $\Delta t_{in}$, and the output time difference (that is, the time difference between the rising edges of the first amplified signal and the second amplified signal) is $\Delta t_{out}$, time difference amplification factor $G_t$, which is the ratio thereof, is expressed by following Equation 1.

[Math. 1]

$$G_t = \frac{\Delta t_{out}}{\Delta t_{in}} = 1 + \frac{i_L}{i_S} \quad \text{(Equation 1)}$$

That is, it can be said that time difference amplification factor $G_t$ is the ratio of the discharge current ($i_s+i_L$) of first capacitor 28a in the large current mode to the discharge current ($i_s$) of first capacitor 28a and second capacitor 28b in the small current mode.

In this way, time difference amplification factor $G_t$ is determined by the output current ratio of the two current sources. For that reason, a time difference amplification factor that is strong against the influence of temperature characteristics is realized, and DLL circuit 10 including time difference amplifier circuit 11 can perform phase adjustment with high resolution that is strong against the influence of temperature characteristics.

It should be noted that Equation 1 described above holds when the input voltage (that is, the voltage of the negative electrode input terminal) of first comparator 27a does not reach the threshold voltage (that is, voltage Vth of the positive electrode input terminal) within period t2 (that is, input time difference $\Delta t_{in}$), that is, when the input time difference is in the unsaturated region.

On the other hand, when the input voltage (that is, the voltage of the negative electrode input terminal) of first comparator 27a reaches the threshold voltage (that is, voltage Vth of the positive electrode input terminal) within period t2 (that is, input time difference $\Delta t_{in}$), that is, when the time difference of the input signal is in the saturation region, time difference amplification factor $G_t$ is expressed by following Equation 2.

[Math. 2]

$$G_t = \frac{\Delta t_{out}}{\Delta t_{in}} = 1 + \left\{ \frac{C(VDD - V_{th})}{i_S + i_L} \frac{1}{\Delta t_{in}} \right\} \times \frac{i_L}{i_S} \quad \text{(Equation 2)}$$

That is, time difference amplification factor $G_t$ is a value that depends on input time difference $\Delta t_{in}$.

As can be seen from Equations 1 and 2 described above, depending on whether the input voltage (that is, the voltage of the negative electrode input terminal) of first comparator 27a reaches the threshold voltage (that is, voltage Vth of the positive electrode input terminal) within period t2 (that is, input time difference $\Delta t_{in}$), time difference amplification factor $G_t$ becomes a value that does not depend on input time difference $\Delta t_{in}$ (Equation 1) or a value that depends on input time difference $\Delta t_{in}$ (Equation 2). That is, time difference amplifier circuit 11 performs non-linear amplification.

Here, as described above, time difference amplifier circuit 11 can operate with respect to the positive and negative input phase differences, and when the input voltage (that is, the voltage of the negative electrode input terminal) of first comparator 27a reaches the threshold voltage (that is, voltage Vth of the positive electrode input terminal) within period t2 (that is, input time difference $\Delta t_{in}$), linear amplification is performed. That is, when following Equation 3 is satisfied, linear amplification according to Equation 1 described above is performed.

[Math. 3]

$$|\Delta t_{in}| \leq \frac{C(VDD - V_{th})}{i_S + i_L} \quad \text{(Equation 3)}$$

As can be seen from this Equation 3, the input time difference range for linear amplification can be adjusted by setting threshold voltage Vth of first comparator 27a and second comparator 27b by first threshold setting circuit 26a and second threshold setting circuit 26b. Here, the input time difference range is a range of time difference in which time difference amplifier circuit 11 can amplify the time difference. In addition, it can be also said that the input time difference range is determined depending on the values of the currents ($i_s$ and $i_L$) output by each of the plurality of current sources.

As described above, DLL circuit 10 according to the present embodiment includes: time difference amplifier circuit 11 that applies, to a first signal and a second signal which are input, processing for amplifying a time difference between an edge that is a change point of a logic level included in the first signal and an edge that is a change point of a logic level included in the second signal, and outputs a first amplified signal and a second amplified signal obtained; phase comparison circuit 12 that calculates a phase difference between the first amplified signal and the second amplified signal output from time difference amplifier circuit 11 and outputs a phase difference signal indicating the phase difference calculated; and variable delay circuit 13 that delays the second signal by an amount of delay depending on the phase difference indicated by the phase difference signal output from phase comparison circuit 12 and outputs a delayed signal obtained by delaying the second signal.

With this, the two input signals are input to phase comparison circuit 12 after the time difference is amplified by time difference amplifier circuit 11. Therefore, even if the phase difference between the two input signals is minute, the phase difference is expanded to the outside of the dead zone of phase comparison circuit 12, and then the phase comparison is performed, so that DLL circuit 10 capable of adjusting a minute phase difference is realized as compared with general DLL circuit 100 with no time difference amplifier circuit.

It should be noted that variable delay circuit 13 is configured by charge pump circuit 13a that outputs a current corresponding to the phase difference, loop filter circuit 13b that stores or discharges electricity according to the current output from charge pump circuit 13a, and delay adjustment circuit 13c that delays the second signal according to the voltage output by loop filter circuit 13b. With this, variable delay circuit 13 that delays the second signal by the amount of delay depending on the phase difference indicated by the phase difference signal output from phase comparison circuit 12 and outputs a delayed signal obtained by delaying the second signal is realized.

In addition, time difference amplifier circuit 11 includes a plurality of current sources (first current source 30a, second current source 31a, third current source 30b, and fourth current source 31b), and control circuits (first slew rate control circuit 20a and second slew rate control circuit 20b) that switch between a large current mode that operates at least two of the plurality of current sources and a small current mode that operates only one of the plurality of current sources according to the combination of the logic levels of the first signal and the second signal, With this, time difference amplifier circuit 11 that amplifies the input time difference by dynamically changing the number of current sources to be used is realized.

In addition, the amplification factor of the time difference by time difference amplifier circuit 11 and the input time difference range which is the range of the time difference in which time difference amplifier circuit 11 can linearly amplify the time difference are determined depending on the values of the currents ($i_s$ and $i_L$) output by each of the plurality of current sources. With this, the time difference amplification factor and the input time difference range in time difference amplifier circuit 11 can be set to desired values by the output currents of the plurality of current sources provided in time difference amplifier circuit 11.

In addition, the plurality of current sources include first current source 30a and second current source 31a, the control circuit includes first slew rate control circuit 20a, and first slew rate control circuit 20a includes first capacitor 28a, first switch 23a that switches between connecting and disconnecting (i) first capacitor 28a and (ii) first current source 30a and second current source 31a according to the logic level of the first signal, and second switch 24a that switches whether second current source 31a is operated according to the logic level of the second signal. Here, first slew rate control circuit 20a further includes first comparator 27a, and third switch 25a that switches on and off according to the logic level of the first signal. Third switch 25a, first capacitor 28a, and the first input terminal (negative electrode input terminal) of first comparator 27a are connected to one end of first switch 23a, and one end of second switch 24a and first current source 30a are connected to the other end of first switch 23a. Second current source 31a is connected to the other end of second switch 24a.

With this, the large current mode is switched to the small current mode by switching second current source 31a from on to off while first current source 30a is on, so that compared with the method of switching on and off both of the two current sources, the current value decreases smoothly in continuous time, and amplification for a minute time difference becomes possible.

Then, first slew rate control circuit 20a further includes first threshold setting circuit 26a that outputs a predetermined voltage to the second input terminal (positive electrode input terminal) of first comparator 27a. With this, setting threshold voltage $V_{th}$ of first comparator 27a makes it possible to adjust the input time difference range which is linear amplification.

In addition, the plurality of current sources include third current source 30b and fourth current source 31b, the control circuit further includes second slew rate control circuit 20b, and second slew rate control circuit 20b includes second capacitor 28b, fourth switch 23b that switches between connecting and disconnecting (i) second capacitor 28b and (ii) third current source 30b and fourth current source 31b according to the logic level of the second signal, and fifth switch 24b that switches whether fourth current source 31b is operated according to the logic level of the first signal. Here, second slew rate control circuit 20b further includes second comparator 27b, and sixth switch 25b that switches on and off according to the logic level of the second signal. Sixth switch 25b, second capacitor 28b, and the first input terminal (negative electrode input terminal) of second comparator 27b are connected to one end of fourth switch 23b, and one end of fifth switch 24b and third current source 30b are connected to the other end of fourth switch 23b. Fourth current source 31b is connected to the other end of fifth switch 24b.

With this, the large current mode is switched to the small current mode by switching fourth current source 31b from on to off while third current source 30b is on, so that compared with the method of switching on and off both of the two current sources, the current value decreases smoothly in continuous time, and amplification for a minute time difference becomes possible.

In addition, second slew rate control circuit 20b further includes second threshold setting circuit 26b that outputs a predetermined voltage to the second input terminal (positive electrode input terminal) of second comparator 27b, With this, setting threshold voltage $V_{th}$ of second comparator 27b makes it possible to adjust the input time difference range which is linear amplification.

Embodiment 2

Figure 8:
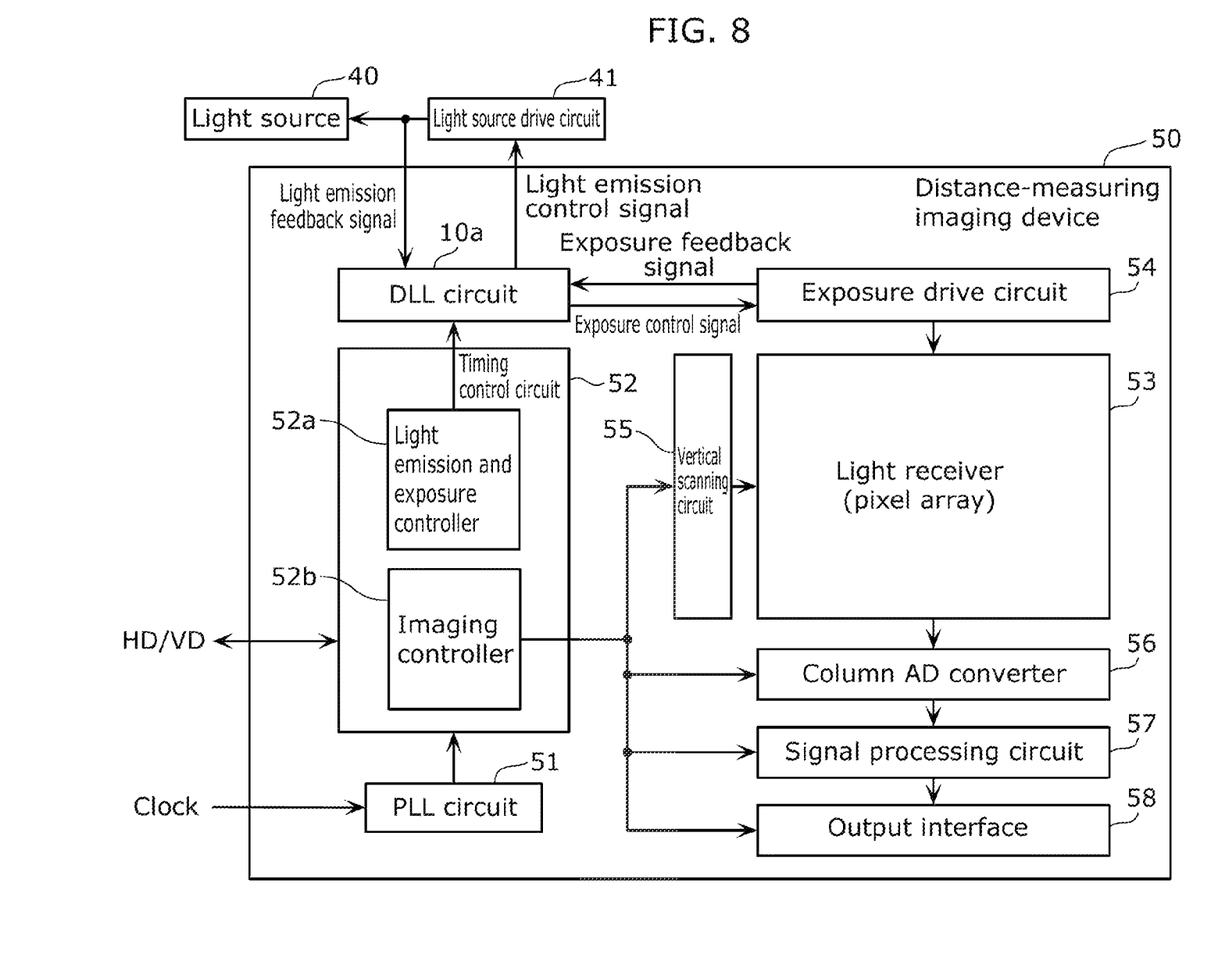
FIG. 8 is a block diagram showing a configuration of a distance-measuring imaging device according to Embodiment 2.

FIG. 8 is a block diagram showing the configuration of distance-measuring imaging device 50 according to Embodiment 2. Distance-measuring imaging device 50 is a device that generates a distance image by imaging, and includes DLL circuit 10a, phase-locked loop (PLL) circuit 51, timing control circuit 52, light receiver 53, exposure drive circuit 54, vertical scanning circuit 55, column AD converter 56, signal processing circuit 57, and output interface 58. It should be noted that in this figure, light source 40 and light source drive circuit 41 that operate in cooperation with distance-measuring imaging device 50 are also shown.

PLL circuit 51 supplies a clock synchronized with a clock input from the outside to timing control circuit 52.

Timing control circuit 52 includes light emission and exposure controller 52a that operates in synchronization with the clock supplied from PLL circuit 51, and supplies a clock signal for controlling light emission and exposure to DLL circuit 10a by exchanging horizontal drive signal HD and vertical drive signal VD with the outside, and imaging controller 52b that supplies control signals to vertical scanning circuit 55, column AD converter 56, signal processing circuit 57, and output interface 58.

DLL circuit 10a includes two DLL circuits 10 according to Embodiment 1. One DLL circuit 10 outputs the clock signal for light emission output from timing control circuit 52 as the second signal, the drive signal output from light source drive circuit 41 as the first signal, and the delayed signal as the light emission control signal, to light source drive circuit 41. The other DLL circuit 10 outputs the clock signal for exposure output from timing control circuit 52 as the second signal, the exposure feedback signal output from exposure drive circuit 54 as the first signal, and the delayed signal as the exposure control signal, to exposure drive circuit 54.

Light source drive circuit 41 is a circuit that outputs a drive signal for emitting light from light source 40 to light source 40 and DLL circuit 10a according to the light emission control signal output from DLL circuit 10a.

Light source 40 is an LED or the like that emits light such as infrared light to a subject to be distance measured when receiving a drive signal from light source drive circuit 41.

Exposure drive circuit 54 is a circuit that supplies a drive signal for causing light receiver 53 to be exposed to light receiver 53 and outputs the drive signal to DLL circuit 10a as an exposure feedback signal according to the exposure control signal output from DLL circuit 10a.

Light receiver 53 is a pixel array in which pixels including light receiving elements are arranged two-dimensionally.

Vertical scanning circuit 55 is a circuit that outputs a control signal for reading out the signal charge accumulated in the pixel to light receiver 53 row by row.

Column AD converter 56 is a circuit that is configured by A/D converters provided corresponding to the respective columns of light receiver 53 and converts analog signal charges read out from the pixels of light receiver 53 into digital values.

Signal processing circuit 57 is a processor, memory, and the like that temporarily stores the digital value output from column AD converter 56, calculates the distance to the subject for each pixel of light receiver 53 by performing a calculation for distance measurement, and generates the distance image. The distance is calculated by, for example, a time of flight (TOF) method, in which pulsed light is emitted from light source 40 and the time until the reflected light returns is measured by light receiver 53, or the like.

Output interface 58 is an interface circuit such as high-definition multimedia interface (HDMI (registered trademark)) that outputs a distance image generated by signal processing circuit 57 to the outside.

In distance-measuring imaging device 50 according to the present embodiment configured as described above, light source drive circuit 41 is placed in the feedback loop (path for inputting the delayed signal as the first signal) of PLL circuit 10a, and the pulsed light from light source 40 is continuously emitted with high timing accuracy accompanied by minute phase difference adjustment. In addition, exposure drive circuit 54 is placed in the feedback loop (path for inputting the delayed signal as the first signal) of DLL circuit 10a, and the exposure at light receiver 53 is performed with high timing accuracy accompanied by minute phase difference adjustment.

As described above, distance-measuring imaging device 50 according to the present embodiment includes light receiver 53 that performs photoelectric conversion, DLL circuit 10a according to Embodiment 1, and timing control circuit 52 that gives a second signal to DLL circuit 10a, and DLL circuit 10a outputs a delayed signal to at least one of light source drive circuit 41 that drives the light source for distance measurement or exposure drive circuit 54 that drives light receiver 53 for exposure, and receives a feedback signal output from at least one of them as the first signal.

With this, since DLL circuit 10a capable of adjusting a minute phase difference is used, distance-measuring imaging device 50 capable of performing stable distance measurement with high accuracy is realized.

The DLL circuit, the time difference amplifier circuit, and the distance-measuring imaging device according to the present disclosure have been described above based on Embodiments 1 and 2, but the present disclosure is not limited to these embodiments. Forms obtained by making various modifications to the embodiments that can be conceived by those skilled in the art, as well as other forms constructed by combining parts of structural components in the embodiments, without departing from the spirit of the present disclosure, are also included in the scope of the present disclosure.

For example, in the above embodiments, time difference amplifier circuit 11 includes two current sources for one slew rate control circuit, but the present invention is not limited thereto, and may have three or more current sources. It may be configured to switch the number of current sources used in the large current mode and the small current mode.

In addition, in time difference amplifier circuit 11 in the above embodiment, the respective output currents of first current source 30a and third current source 30b are $i_s$, and the respective output currents of second current source 31a and fourth current source 31b are $i_L$. However, the relationship between these two output currents may be $i_s=i_L$ or $i_s \neq i_L$. In any case, by using two current sources, it is possible to output a larger current than when using one current source.

In addition, time difference amplifier circuit 11 in the above embodiment amplifies the time difference by discharging the electric charge charged in the capacitor in advance with a current source, but on the contrary, it may amplify the time difference by charging a capacitor that holds a constant voltage in advance with a current source.

In addition, in time difference amplifier circuit 11 in the above embodiment, both first threshold setting circuit 26a and second threshold setting circuit 26b output threshold voltage Vth, but it is not always necessary to output same threshold voltage Vth. It is only necessary that the voltage output by each is set to a desired value in consideration of the amplification factor for the positive and negative phase differences. In addition, when both first threshold setting circuit 26a and second threshold setting circuit 26b output the same threshold voltage, first threshold setting circuit 26a and second threshold setting circuit 26b may be realized by one common threshold setting circuit.

In addition, in time difference amplifier circuit 11 in the above embodiment, the capacitor is connected to the negative electrode input terminal of the comparator and the threshold setting circuit is connected to the positive electrode input terminal thereof, but on the contrary, the threshold setting circuit may be connected to the negative electrode input terminal of the comparator and the capacitor may be connected to the positive electrode input terminal thereof, Even so, the logic of the amplified signal output from the comparator is only inverted, and the information indicated by the amplified signal does not change.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The DLL circuit, the time difference amplifier circuit, and the distance-measuring imaging device according to the present disclosure are useful as a DLL circuit, a time difference amplifier circuit, and a distance-measuring imaging device capable of adjusting a minute phase difference, for example, in a wide range of applications such as in-vehicle applications.

The invention claimed is:
1. A delay-locked loop (DLL) circuit, comprising:
a time difference amplifier circuit that includes a plurality of current sources for setting a time difference amplification factor and an input time difference range, the time difference amplifier circuit amplifying, to a first signal and a second signal which are input, a time difference between an edge that is a change point of a logic level included in the first signal and an edge that is a change point of a logic level included in the second signal, using the plurality of current sources and outputting a first amplified signal and a second amplified signal obtained;

a phase comparison circuit that calculates a phase difference between the first amplified signal and the second amplified signal output from the time difference amplifier circuit and outputs a phase difference signal indicating the phase difference calculated; and a variable delay circuit that delays the second signal by an amount of delay depending on the phase difference indicated by the phase difference signal output from the phase comparison circuit and outputs a delayed signal obtained by delaying the second signal.

2. The DLL circuit according to claim 1,
wherein the variable delay circuit includes:
a charge pump circuit that outputs a current corresponding to the phase difference;
a loop filter circuit that stores or discharges electricity according to the current output from the charge pump circuit; and
a delay adjustment circuit that delays the second signal according to a voltage output by the loop filter circuit.

3. The DLL circuit according to claim 1,
wherein the time difference amplifier circuit further includes:
a control circuit that switches between a large current mode for operating at least two of the plurality of current sources and a small current mode for operating only one of the plurality of current sources, depending on a combination of the logic level of the first signal and the logic level of the second signal.

4. The DLL circuit according to claim 3,
wherein the time difference amplification factor and the input time difference range are determined depending on a value of a current output by each of the plurality of current sources, and
the input time difference range is a range of the time difference that the time difference amplifier circuit is capable of linearly amplifying the time difference.

5. The DLL circuit according to claim 3,
wherein the plurality of current sources include a first current source and a second current source,
the control circuit includes a first slew rate control circuit, and
the first slew rate control circuit includes:
a first capacitor;
a first switch that switches between connecting and disconnecting (i) the first capacitor and (ii) the first current source and the second current source according to the logic level of the first signal; and
a second switch that switches whether the second current source is operated according to the logic level of the second signal.

6. The DLL circuit according to claim 5,
wherein the first slew rate control circuit further includes:
a first comparator; and
a third switch that switches on and off according to the logic level of the first signal, the third switch, the first capacitor, and a first input terminal of the first comparator are connected to one end of the first switch,
one end of the second switch and the first current source are connected to another end of the first switch, and
the second current source is connected to another end of the second switch.

7. The DLL circuit according to claim 6,
wherein the first slew rate control circuit further includes a first threshold setting circuit that outputs a predetermined voltage to a second input terminal of the first comparator.

8. The DLL circuit according to claim 3,
wherein the plurality of current sources further include a third current source and a fourth current source,
the control circuit further includes a second slew rate control circuit, and
the second slew rate control circuit includes:
a second capacitor;
a fourth switch that switches between connecting and disconnecting (i) the second capacitor and (ii) the third current source and the fourth current source, according to the logic level of the second signal; and
a fifth switch that switches whether the fourth current source is operated according to the logic level of the first signal.

9. The DLL circuit according to claim 8,
wherein the second slew rate control circuit further includes:
a second comparator; and
a sixth switch that switches on and off according to the logic level of the second signal,
the sixth switch, the second capacitor, and a first input terminal of the second comparator are connected to one end of the fourth switch,
one end of the fifth switch and the third current source are connected to another end of the fourth switch, and
the fourth current source is connected to another end of the fifth switch.

10. The DLL circuit according to claim 9,
wherein the second slew rate control circuit further includes a second threshold setting circuit that outputs a predetermined voltage to a second input terminal of the second comparator.

11. A distance-measuring imaging device, comprising:
a light receiver that performs photoelectric conversion;
the DLL circuit according to claim 1; and
a timing control circuit that gives the second signal to the DLL circuit,
wherein the DLL circuit outputs the delayed signal to at least one of a light source drive circuit that drives a light source for distance measurement or an exposure drive circuit that drives the light receiver for exposure, and receives a feedback signal output from the at least one of the light source drive circuit or the exposure drive circuit as the first signal.

12. The DLL circuit according to claim 1, wherein the phase difference signal output from the phase comparison circuit comprises two independent phase difference signals.

13. The DLL circuit according to claim 1, wherein the delayed signal output from the variable delay circuit is input to the time difference amplifier circuit as the first signal.

14. A time difference amplifier circuit for amplifying a time difference between a first signal having a logic level and a second signal having a logic level, comprising:
a plurality pairs of current sources for setting a time difference amplification factor and an input time difference range; and
a control circuit that switches between a large current mode for operating both pair of at least one of the plurality pairs of current sources and a small current mode for operating only one of the pair of at least one of the plurality pairs of current sources, depending on a combination of the logic level of the first signal and the logic level of the second signal, wherein the time difference amplifier circuit amplifies a time difference between an edge that is a change point of the logic level of the first signal and an edge that is a change point of the logic level of the second signal, using the plurality pairs of current sources, and outputs a first amplified signal and a second amplified signal.

* * * * *